United States Patent
Sevic et al.

[11] Patent Number: 6,069,525
[45] Date of Patent: May 30, 2000

[54] DUAL-MODE AMPLIFIER WITH HIGH EFFICIENCY AND HIGH LINEARITY

[75] Inventors: John F. Sevic; Richard J. Camarillo, both of San Diego, Calif.

[73] Assignee: Qualcomm Incorporated, San Diego, Calif.

[21] Appl. No.: 08/843,904

[22] Filed: Apr. 17, 1997

[51] Int. Cl.$^7$ .................................................. H03F 3/68
[52] U.S. Cl. ........................................ 330/51; 330/124 R
[58] Field of Search ................................. 330/51, 124 R, 330/129, 295, 296, 297

[56] References Cited

U.S. PATENT DOCUMENTS

| | | | |
|---|---|---|---|
| 3,325,738 | 6/1967 | Busby et al. | 325/477 |
| 3,469,195 | 9/1969 | Harwood | 325/405 |
| 3,514,710 | 5/1970 | Janning, Jr. | 330/29 |
| 3,665,507 | 5/1972 | Pell | 325/315 |
| 3,886,380 | 5/1975 | Sobajima et al. | 307/237 |
| 4,041,396 | 8/1977 | Fedde | 325/150 |
| 4,054,849 | 10/1977 | Yamada | 333/14 |
| 4,158,180 | 6/1979 | Challen | 330/298 |
| 4,207,538 | 6/1980 | Goel | 330/277 |
| 4,223,274 | 9/1980 | Paulke et al. | 330/133 |
| 4,263,560 | 4/1981 | Ricker | 330/129 |
| 4,320,350 | 3/1982 | Drapac | 330/202 |
| 4,380,711 | 4/1983 | Cunningham | 307/491 |
| 4,426,625 | 1/1984 | Harwood et al. | 330/254 |
| 4,439,744 | 3/1984 | Kumar et al. | 330/285 |
| 4,447,783 | 5/1984 | Quick | 323/275 |
| 4,495,648 | 1/1985 | Giger | 455/73 |
| 4,500,848 | 2/1985 | Marchand et al. | 330/285 |
| 4,510,460 | 4/1985 | Tamura | 330/285 |
| 4,514,702 | 4/1985 | Zogg | 330/254 |
| 4,523,155 | 6/1985 | Walczak et al. | 330/279 |
| 4,560,949 | 12/1985 | Young | 330/284 |
| 4,578,603 | 3/1986 | McPherson | 307/493 |
| 4,593,409 | 6/1986 | Miller | 455/73 |
| 4,602,218 | 7/1986 | Vilmur et al. | 330/279 |
| 4,607,234 | 8/1986 | Nordholt et al. | 330/278 |
| 4,613,990 | 9/1986 | Halpern | 455/33 |
| 4,654,882 | 3/1987 | Ikeda | 455/88 |

(List continued on next page.)

FOREIGN PATENT DOCUMENTS

| | | |
|---|---|---|
| 0537733 | 4/1993 | European Pat. Off. . |
| 0594358 | 4/1994 | European Pat. Off. . |
| 5997213 | 6/1994 | Japan . |

OTHER PUBLICATIONS

"A 900 MHz CMOS RF Popwer Amplifier with Programmable Output Power" by Maryam Rofoufaran et al.; Integrated Citcuits & Systems Laboratory.

J.D. Hay et al. "The Exploratory Development of a High Power S–Band Solid State Radar Transmitter", IEEE International Radar Conference, May 7, 1990, pp. 135–140.

*Primary Examiner*—Steven J. Mottola
*Attorney, Agent, or Firm*—Roger W. Martin; Charles D. Brown; Philip Wadsworth

[57] ABSTRACT

An amplifier circuit having a high linearity mode of operation and a high efficiency mode of operation. The amplifier circuit comprises an amplifier having a variable active device periphery and a variable supply voltage; and a control circuit, coupled to the amplifier, for decreasing the variable active device periphery and increasing the variable supply voltage when in the high linearity mode of operation, and for increasing the variable active device periphery and decreasing the variable supply voltage when in the high efficiency mode of operation.

6 Claims, 3 Drawing Sheets

U.S. PATENT DOCUMENTS

| | | | |
|---|---|---|---|
| 4,661,993 | 4/1987 | Leland et al. | 455/103 |
| 4,709,403 | 11/1987 | Kikuchi | 455/126 |
| 4,723,304 | 2/1988 | Maeda | 455/69 |
| 4,727,337 | 2/1988 | Jason | 330/298 |
| 4,740,964 | 4/1988 | Stalick | 370/110 |
| 4,797,632 | 1/1989 | Guery | 330/285 |
| 4,816,772 | 3/1989 | Klotz | 330/254 |
| 4,870,698 | 9/1989 | Katsuyama et al. | 455/67 |
| 4,893,093 | 1/1990 | Coanuer et al. | 330/295 |
| 4,901,032 | 2/1990 | Komiak | 330/277 |
| 4,901,307 | 2/1990 | Gilhousen et al. | 370/18 |
| 5,029,298 | 7/1991 | Chiba et al. | 330/285 |
| 5,083,096 | 1/1992 | Miyazaki | 330/279 |
| 5,099,204 | 3/1992 | Wheatley, III | 330/279 |
| 5,107,225 | 4/1992 | Wheatley, III et al. | 330/279 |
| 5,132,634 | 7/1992 | Suarez | 330/129 |
| 5,136,300 | 8/1992 | Clarke | 342/175 |
| 5,146,180 | 9/1992 | Hyakutake | 330/254 |
| 5,152,004 | 9/1992 | Vaisanen et al. | 455/68 |
| 5,163,181 | 11/1992 | Koontz | 455/10.3 |
| 5,175,871 | 12/1992 | Kunkel | 455/69 |
| 5,192,919 | 3/1993 | Wieczorek | 330/129 |
| 5,251,330 | 10/1993 | Chiba et al. | 455/91 |
| 5,251,331 | 10/1993 | Schwent et al. | 330/297 X |
| 5,256,987 | 10/1993 | Klbayashi et al. | 330/295 |
| 5,287,543 | 2/1994 | Wolkstein | 455/103 |
| 5,329,548 | 7/1994 | Borg | 455/103 |
| 5,339,046 | 8/1994 | Kornfeld et al. | 330/277 |
| 5,423,078 | 6/1995 | Epperson et al. | 455/89 |
| 5,438,684 | 8/1995 | Schwent et al. | 455/89 |
| 5,487,185 | 1/1996 | Halonen | 455/115 |
| 5,530,923 | 6/1996 | Heinonen et al. | 330/51 X |
| 5,541,554 | 7/1996 | Stengel et al. | 330/51 |
| 5,568,086 | 10/1996 | Schuss et al. | 330/124 R |
| 5,608,353 | 3/1997 | Pratt | 330/295 | ns
DUAL-MODE AMPLIFIER WITH HIGH EFFICIENCY AND HIGH LINEARITY

BACKGROUND OF THE INVENTION

I. Field of the Invention

The present invention relates to radio frequency (RF) amplifiers. More particularly, the present invention relates to a novel and improved dual-mode RF amplifier that exhibits both high efficiency and high linearity.

II. Description of the Related Art

As is known in the art of amplifier design, high linearity and high efficiency are generally mutually exclusive design considerations. That is to say that when one is designing a particular transistor-based amplifier, one must usually make a tradeoff between the high linearity and high efficiency. The difference between high linearity and high efficiency is manifested by saturation characteristics which are determined by the load impedance in relation to the current capability and breakdown voltage of the amplifier. Thus, a designer who wishes to design a highly linear amplifier will generally choose a relatively low load impedance for a given supply voltage. Highly linear amplifiers maintain the integrity of the input signal envelope at the expense of higher average power dissipation. This high average power dissipation which results from overlap of current and voltage in the transistor over time is particularly undesirable in a battery-powered portable transmitter because it reduces the battery life, and thus the transmit time of the portable transmitter between battery charges.

Conversely, a designer who wishes to design a highly efficient amplifier will generally choose a relatively higher load impedance for the same supply voltage. Highly efficient amplifiers maintain a lower average power dissipation at the expense of "clipping" of the input signal at high input amplitudes due to premature saturation of the amplifier. Although clipping the input signal gives rise to high efficiency and longer battery life because the device's power dissipation (and thus the instantaneous voltage/current overlap and power dissipation) is minimized during saturation, it results in distortion of the input signal envelope, and consequent generation of in-band spectral sidelobes of information. Furthermore, clipping generates higher-order harmonics that may be spread outside of the allowed operating bandwidth of the transmitter, causing interference to other RF devices transmitting or receiving on other frequencies.

In the field of wireless telecommunications, such as in various cellular, Personal Communication Services (PCS), and wireless local loop (WLL) communication systems, many different communication standards exist for these wireless communication systems. For example, Code-Division Multiple Access (CDMA) digital communications may be governed in the United States by either Telecommunications Industry Association (TIA)/Electronic Industries Association (EIA) Interim Standard IS-95 for cellular bands, or ANSI J-STD-008 for PCS bands. Additionally, Time-Division Multiple Access (TDMA) digital communications may be governed by the TIA/EIA IS-54 or by the European standard Global System for Mobile Communications (GSM). Finally, analog FM-based communications may be governed by the Advanced Mobile Phone System (AMPS) standard, or one of its improvement standards such as N-AMPS.

For each of these communication system standards, a long-felt need exists for an amplifier for a wireless communication device which exhibits the high linearity needed for signal integrity, as well as the high efficiency needed for longer operating time. This is particularly true for dual-mode communication devices that can operate according to two different standards (such as CDMA/AMPS), because each of the standards may have different linearity requirements. For example, the linearity requirements in a CDMA communication device are more stringent than those of an AMPS communication device which has no in-band linearity requirement. Thus a dual-mode CDMA/AMPS communication device would benefit greatly from being able to take advantage of a high linearity amplifier while operating in a CDMA mode, while still being able to operate with high efficiency while in the AMPS mode where there are no in-band linearity requirements.

Although there have been various attempts to create a highly efficient amplifier that is also highly linear, these attempts contain inherent problems which limit their effectiveness. For example, Doherty-type amplifiers are well known in the art as being highly efficient and also highly linear. A Doherty-type amplifier modulates the load impedance in response to the envelope of the input signal by using two amplifiers in parallel, and the output of one of the amplifiers in series with a quarter-wavelength phase shifter. An example of such an amplifier is illustrated in U.S. Pat. No. 5,568,086 to Schuss et al., entitled "LINEAR POWER AMPLIFIER FOR HIGH EFFICIENCY MULTI-CARRIER PERFORMANCE." However, a significant drawback to the Doherty-type design of Schuss et al. is that a quarter-wavelength phase shifter may be difficult and costly to realize at certain frequencies in the mobile telephone environment, such as the 850 MHz cellular band. Additionally, Doherty-type amplifiers are narrowband "tuned" amplifiers that operate best around a single frequency and are ill-suited for broadband use mobile telephone environment.

Another example solution is illustrated in U.S. Pat. No. 5,175,871 to Kunkel, entitled "POWER AMPLIFIER FOR A CELLULAR TELEPHONE." The amplifier of Kunkel uses a one non-linear amplifier stage which may be used when non-linear behavior is desired, and one linear amplifier stage which may be switched in when linear power amplification is desired. However, a significant drawback of Kunkel is the switch loss which reduces analog mode efficiency. An additional drawback is the increased expense of providing two separate amplifiers, each with its own design characteristics.

Thus, there is a need for an amplifier that is both highly efficient and highly linear which avoids the problems of the prior art.

SUMMARY OF THE INVENTION

The present invention is a novel and improved dual-mode RF amplifier which is both highly efficient and highly linear. The invention is embodied in amplifier circuit having a high linearity mode of operation and a high efficiency mode of operation. The amplifier circuit comprises an amplifier having a variable active device periphery and a variable supply voltage; and a control circuit, coupled to the amplifier, for decreasing the variable active device periphery and increasing the variable supply voltage when in the high linearity mode of operation, and for increasing the variable active device periphery and decreasing the variable supply voltage when in the high efficiency mode of operation. Additionally, the quiescent current may also be varied in order to increase efficiency even further.

The variable active device periphery comprises a plurality of transistor stages. The control circuit decreases the variable active device periphery by biasing off at least one of the plurality of transistor stages, and increases the variable active device periphery by biasing on at least one of the plurality of transistor stages. Each of the plurality of transistor stages has a transistor output coupled to the variable supply voltage and an input coupled to a signal to be amplified. The control circuit may be responsive to a mode select signal indicative of the high efficiency mode of operation or the high linearity mode of operation.

The present invention also encompasses a method for operating an amplifier circuit having a variable active device periphery and a variable supply voltage. The method comprises the steps of decreasing said variable active device periphery and increasing said variable supply voltage when in a high linearity mode of operation, and increasing said variable active device periphery and decreasing said variable supply voltage when in a high efficiency mode of operation.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

Figure 1:
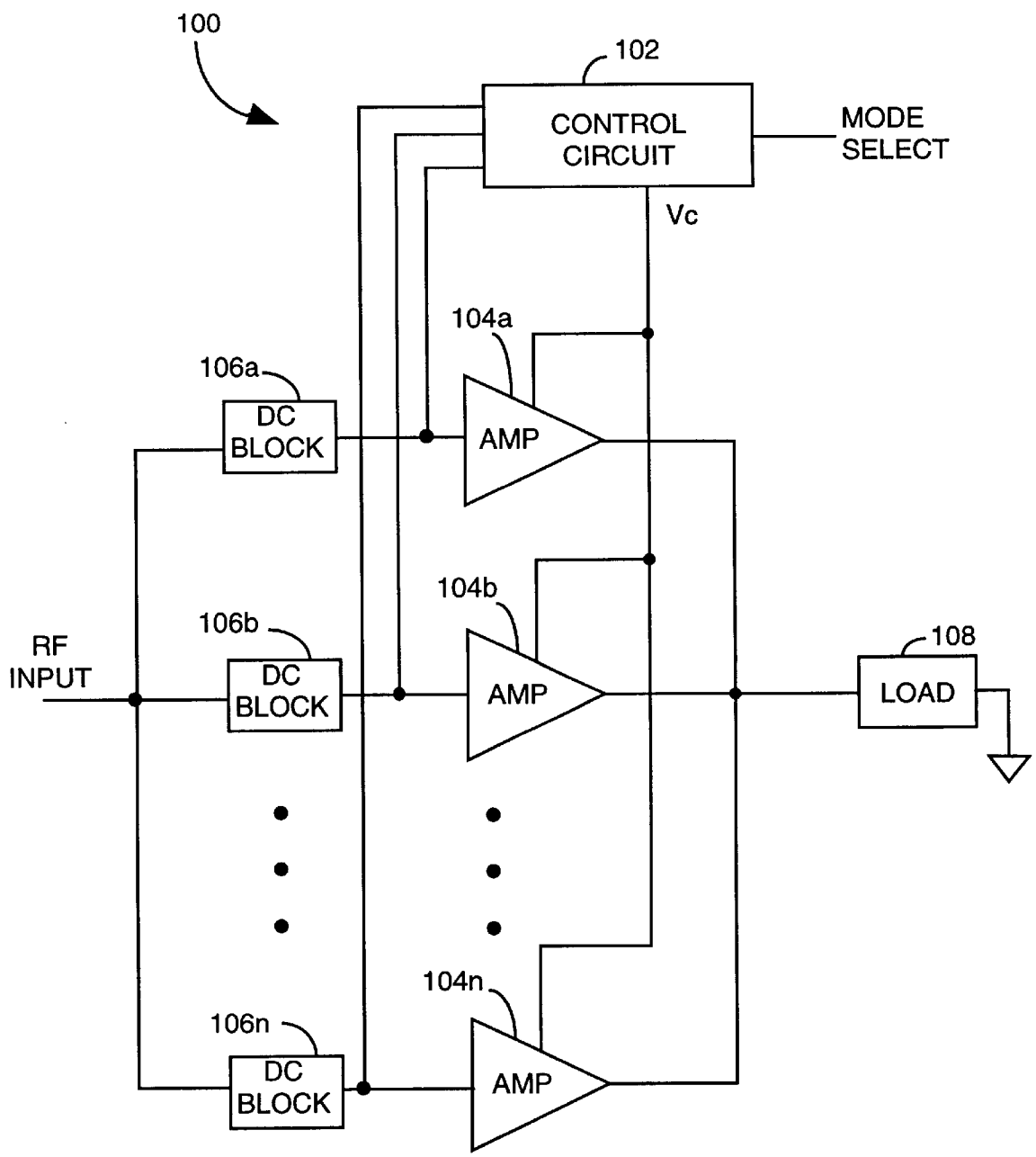
FIG. 1 is a block diagram of the amplifier of the present invention.

Referring now to FIG. 1, a block diagram of the RF amplifier 100 of the present invention is shown. The RF input signal, which may generally be a carrier signal modulated with information in amplitude, frequency, or phase is presented to the inputs of DC blocks 106a–106n. DC blocks 106a–106n, in the simplest embodiment, may be DC blocking capacitors. At the high frequencies of the RF input signal, the DC blocks 106a–106n pass the RF input signal through to their respective parallel amplifier stages 104a–104n. Amplifier stages 104a–104n may be bipolar junction transistors (BJTs), field effect transistors (FETs) or any other transistor type as is known in the art, whether CMOS, NMOS, PMOS or otherwise. Additionally, amplifier stages 104a–104n may be hybrid-type devices or tubes or TWT's as are known in the art. The present invention is not limited by the specific construction of amplifier stages 104a–104n.

When biased on by control circuit 102, each amplifier stage 104a–104n independently amplifies the RF input signal according to a gain characteristic determined by the device's construction and the bias voltages applied to it. The outputs of amplifier stages 104a–104n are combined and applied to a load 108 which may include a matching network, a diplexer, and isolator, and an antenna in a wireless communication device.

Although only three parallel amplifier stages 104a–104n are depicted, it would be well understood by one skilled in the art that more or fewer than three amplifier stages may be used with the present invention. For example, in one embodiment of the present invention, only two amplifier stages 104a and 104b are used.

Control circuit 102 selectively applies a DC bias to the inputs of parallel amplifier stages 104a–104n in order to switch the individual amplifier stages on or off. For example, if each of amplifier stages 104a–104n was a FET with a maximum power output of one watt, control circuit 102 might apply a DC bias to the gates of amplifier stages 104a and 104b but not 104n in order to get a maximum output through load 108 of two watts. Similarly, for an output power through load 108 of one watt only, control circuit 102 might apply a DC bias to the gates of amplifier stage 104a only, it being understood that the other amplifier stages 104b–104n would not be active in the absence of a DC bias applied to their gates. A similar scheme would be followed if amplifier stages 104a–104n were BJT devices, with the DC bias being applied to their respective bases.

The appropriate number of amplifier stages may be selected by control circuit 102 in response to a desired output power, which may in turn be determined in response to a power control circuit (not shown) within a wireless communication device employing the present invention. A similar topology as that just described which results in extremely favorable DC efficiency, and thus longer battery life, is described in greater detail in copending U.S. patent application Ser. No. 08/579,169 entitled "EFFICIENT PARALLEL-STAGE POWER AMPLIFIER", filed Dec. 25, 1995 and assigned to the assignee of the present invention, and hereby incorporated by reference, and additionally copending U.S. patent application Ser. No. 08/767,124 entitled "EFFICIENT PARALLEL-STAGE POWER AMPLIFIER", filed Dec. 9, 1996 also assigned to the assignee of the present invention, also hereby incorporated by reference.

In the present invention, control circuit 102 provides an additional function. Specifically, control circuit 102 varies the supply voltage, Vc, which is input to each amplifier stage 104a–104n in response to a mode select signal. The mode select signal, for example, may be a logic signal indicating whether a dual-mode CDMA/AMPS wireless communication device employing the present invention is in the CDMA mode of operation or the AMPS mode of operation. More generally, the mode select signal indicates whether the amplifier 100 will operate generally in the high efficiency mode or the high linearity mode. As is known in the art, the linearity or efficiency characteristics of a transistor device are dependent upon the load impedance in relation to the maximum current and supply voltage of the device.

When the mode select signal indicates that the amplifier 100 is to operate in the high linearity mode, control circuit 102 outputs a relatively high supply voltage Vc(max) to at least amplifier stage 104a. Since the saturation characteristics of a transistor are generally proportional to its supply voltage, the saturation voltage of amplifier 100 with Vc(max) being applied to amplifier stage 104a would be relatively high, thereby providing good linearity performance. For a BJT transistor-based amplifier stage, Vc may be applied to the collector, and for a FET transistor-based amplifier stage, Vc may be applied to the drain. Other embodiments use alternate topologies such as common emitter or common source.

Figure 2:
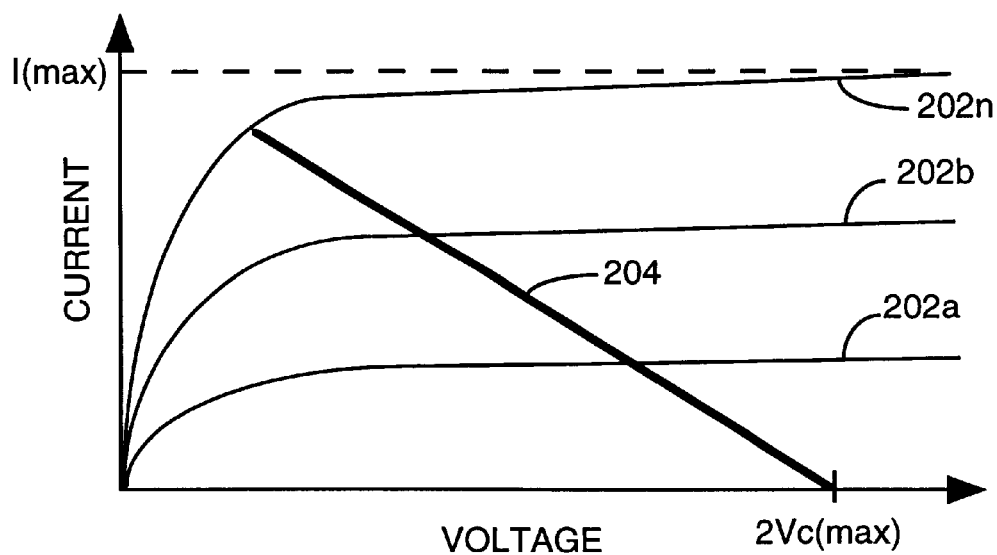
FIG. 2 is a graph of the current-voltage characteristics of the amplifier of the present invention when operating in a high linearity mode.

FIG. 2 is a graph of current as a function of voltage for the amplifier 100 when in the high linearity mode of operation. FIG. 2 is representative of, for example, the case where only amplifier stage 104a is biased on. The curves 202a–202n represent the current-voltage characteristics of the device at various gate-source (FET) or base-collector (BJT) voltages provided by control circuit 102 (FIG. 1). The maximum current generated in this mode is I(max). A load line 204 represents the current-voltage relationship for this configuration for a given load 108 impedance and drain or collector supply voltage of Vc(max). As can be seen from FIG. 2, the load line 204 has been optimally chosen for linearity, with a maximum symmetrical swing, and can handle input voltages on the order of 2Vc(max) without clipping. A typical application of this configuration would be a wireless communication device operating in the digital CDMA mode.

Conversely, when the mode select signal indicates that the amplifier 100 is to operate in the high efficiency mode, control circuit 102 outputs a relatively low supply voltage Vc(min) to at least amplifier stage 104a, thereby increasing its efficiency while simultaneously switching in other amplifier stages 104b–104n.

Figure 3:
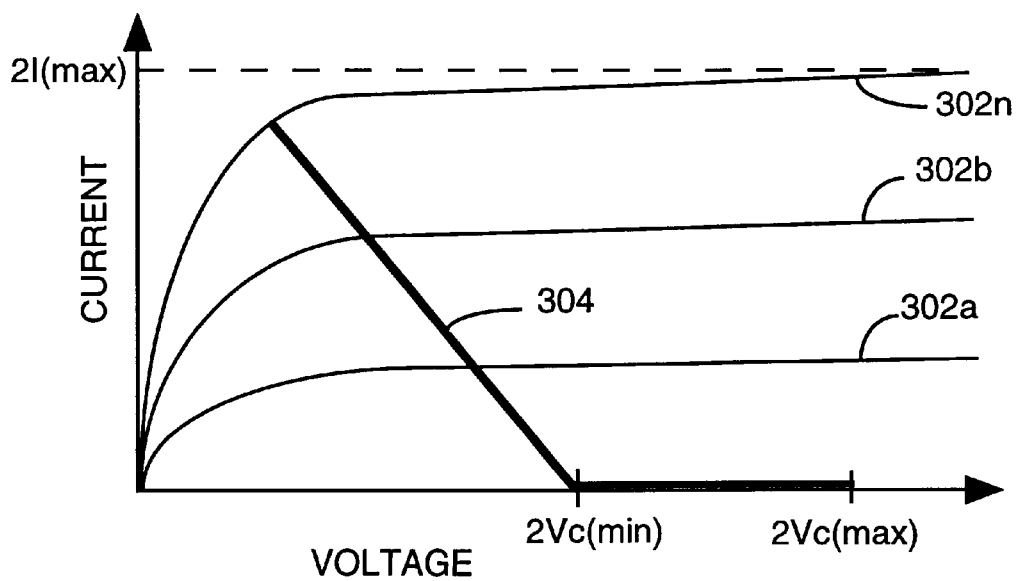
FIG. 3 is a graph of the current-voltage characteristics of the amplifier of the present invention when operating in a high efficiency mode.

This configuration is shown in FIG. 3, where the active periphery (i.e. the gate width for a FET or the base area for a BJT) of the amplifier 100 is increased, for example, by biasing on amplifier stage 104b in addition to 104a. This results in increased current generating capability, such that if amplifier stage 104a and 104b are the same size, the maximum current would double in relation to that of FIG. 2 to a new value of 2I(max). The curves 302a–302n then correspond to the sum of the current from both amplifier stages 104a and 104b for various gate-source (FET) or base-emitter (BJT) voltages applied by control circuit 102. Additionally, the supply voltage, Vc, is reduced by a predetermined amount to a value of Vc(min). Thus, the load line 304 presented by load 108 now represents a high-efficiency mode relative to FIG. 2, causing the amplifier 100 to become voltage limited and exhibit saturation for input voltages on the order of 2Vc(min). This occurs because the higher current capability and the lower drain or collector voltage provided by control circuit 102 induces premature saturation of the active amplifier stages 104a and 104b. As can be seen, the current for the amplifier 100 in the high efficiency mode of FIG. 3 goes to zero above about 2Vc (min), resulting in very low average power dissipation. A typical application of this configuration would be a wireless communication device operating in the analog AMPS mode.

So in other words, given a load 108 impedance of R, which is optimal for linearity for a device periphery of X of amplifier stage 104a at a given supply voltage of Vc(max) (corresponding to FIG. 2), if one increases the device periphery to Y by biasing on amplifier stage 104b, and lowers the supply voltage to Vc(min) (corresponding to FIG. 3), then the load 108 impedance appears relatively larger to the amplifier 100, resulting in a high efficiency mode of operation. Additionally, one may reduce the quiescent current by a predetermined amount to obtain even higher efficiency.

It should be noted that more than one of the amplifier stages 104a–104n may be biased on by control circuit 102 when in the high linearity mode of FIG. 2, and furthermore that more than two of the amplifier stages 104a–104n may be biased on by control circuit 102 when in the high efficiency mode of FIG. 3. The present invention may be generally applied to any number of parallel amplifier stages. Additionally, it should be noted that it may also be desirable to lower the quiescent current being drawn by the amplifier 100 when in the high efficiency mode to gain even more efficiency by reducing the average current. One skilled in the art will understand that various alterations to the present invention in order to optimize it for other applications would still be obvious design considerations.

Figure 4:
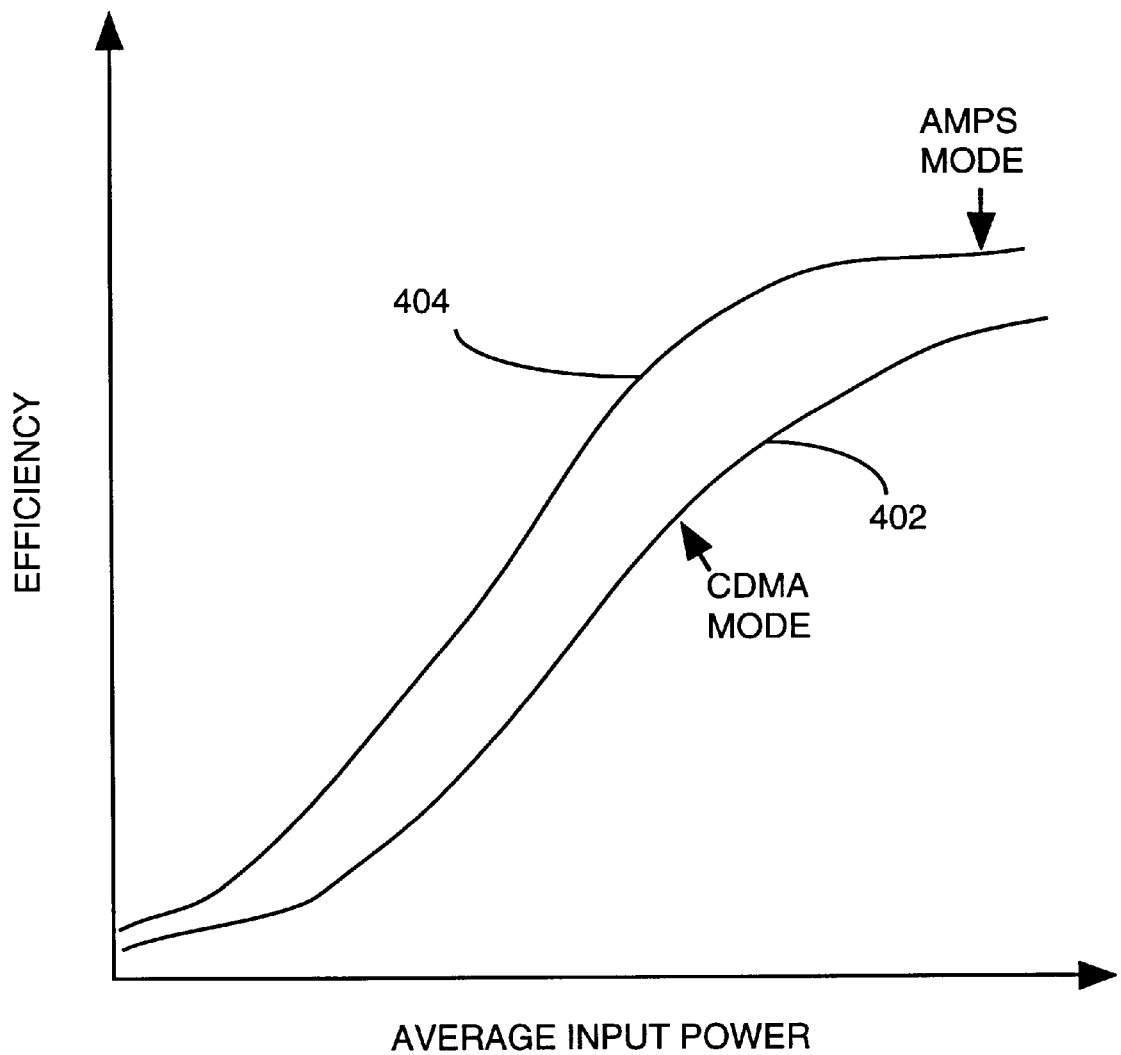
FIG. 4 is a graph of the efficiency as a function of average input power for the amplifier of the present invention.

Turning now to FIG. 4, the advantages in efficiency of the present invention can be readily seen. In FIG. 4, a graph of average load power as a function of average input power is shown. Curve 402 represents the characteristic curve of amplifier 100 when in the high linearity mode. Curve 404 represents the characteristic curve of amplifier 100 when in the high efficiency mode. A pointer on curve 402 indicates where amplifier 100 might be operated at when in a digital CDMA mode, and a separate pointer on curve 404 indicates where amplifier 100 might be operated when in an analog AMPS mode. When in the CDMA mode, the amplifier 100 needs an output power of only about 28 dBm, and therefore operates in the linear region (below the "knee") of curve 402. However, when in the AMPS mode, the amplifier 100 needs and output power of about 31.5 dBm and thus operates in the non-linear, but more power efficient region (above the represents the high efficiency mode of operation with the increased device periphery and lower supply voltage, is shifted higher than curve 402. As such, it can be readily appreciated that the present invention is substantially more power efficient than merely driving an otherwise linear amplifier into its non-linear region.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

We claim:

1. An amplifier circuit comprising:

a first amplifier stage having a first supply voltage input for receiving a supply voltage and a first signal input for receiving a signal to be amplified and a bias signal;

a second amplifier stage having a second supply voltage input for receiving said supply voltage and a second signal input for receiving said signal to be amplified and said bias signal; and a control circuit having a supply voltage output coupled to said first and second supply voltage inputs and having first and second bias signal outputs respectively coupled to said first and second signal inputs, and having a mode select input for receiving a mode select signal, said control circuit for varying said supply voltage and said bias signal in response to said mode select signal, wherein said mode select signal is indicative of first and second operational modes, and wherein said control circuit increases said supply voltage and biases said first amplifier stage to an on state when in said first operational mode, and wherein said control circuit decreases said supply voltage and biases both said first and second amplifier stages to an on state when in said second operational mode.

2. The amplifier circuit of claim 1 wherein said first operational mode is a high linearity mode and said second operational mode is a high efficiency mode.

3. The amplifier circuit of claim 2 wherein said first operational mode is a digital transmission mode and said second operational mode is an analog transmission mode.

4. The amplifier circuit of claim 3 wherein said first and second amplifier stages are respectively first and second field-effect transistors, said first and second supply voltage inputs are respectively first and second transistor drains, and said first and second signal inputs are respectively first and second transistor gates.

5. The amplifier circuit of claim 4 wherein said first and second transistor drains are coupled together.

6. An amplifier circuit having a high-linearity mode of operation and a high-efficiency mode of operation, said amplifier circuit comprising:

an amplifier having a variable active device periphery and a variable supply voltage; and a control circuit, coupled to said amplifier, for decreasing said variable active device periphery and increasing said variable supply voltage when in said high-linearity mode of operation, and for increasing said variable active device periphery and decreasing said variable supply voltage when in said high-efficiency mode of operation, wherein said variable active device periphery comprises a plurality of transistor stages, and wherein said control circuit decreases said variable active device periphery by biasing off at least one of said plurality of transistor stages, and wherein said control circuit increases said variable active device periphery by biasing on said at least one of said plurality of transistor stages, wherein each of said plurality of transistor stages has a transistor output coupled to said variable supply voltage and an input coupled to a signal to be amplified.

* * * * *